(12) United States Patent  
Swetland

(10) Patent No.: US 6,650,548 B1  
(45) Date of Patent: Nov. 18, 2003

(54) APPARATUS, METHOD AND SYSTEM FOR INTERFACING ELECTRONIC CIRCUITS

(76) Inventor: Paul A. Swetland, 728 Washington St., Woodstock, IL (US) 60098

( * ) Notice: Subject to any disclaimer, the term of this patent is extended or adjusted under 35 U.S.C. 154(b) by 0 days.

(21) Appl. No.: 10/163,138

(22) Filed: Jun. 5, 2002

(51) Int. Cl.[7] ............................................... H05K 5/00
(52) U.S. Cl. ...................... 361/780; 439/49; 361/777
(58) Field of Search ................................ 361/807, 809, 361/805, 811, 780, 777; 439/49, 54; 434/224, 301

(56) References Cited

U.S. PATENT DOCUMENTS

| | | | | |
|---|---|---|---|---|
| 3,085,177 A | * | 4/1963 | Thompson | 361/809 |
| 3,205,469 A | | 9/1965 | Frank et al. | 339/18 |
| 3,778,745 A | * | 12/1973 | Fischer | 361/809 |
| D235,554 S | | 6/1975 | Portugal | D13/3 |
| 3,898,535 A | * | 8/1975 | Ebbert | 361/813 |
| 4,039,236 A | | 8/1977 | Schepler | 339/17 |
| 4,129,349 A | | 12/1978 | von Roesgen | 339/17 |
| 4,522,449 A | | 6/1985 | Hayward | 361/407 |
| 4,606,725 A | * | 8/1986 | Chio | 434/224 |
| 4,772,864 A | | 9/1988 | Otto et al. | 333/238 |
| 4,791,722 A | | 12/1988 | Miller, Jr. | 29/850 |
| 4,907,127 A | | 3/1990 | Lee | 361/397 |
| 5,014,163 A | | 5/1991 | Lin | 361/415 |
| 5,309,327 A | | 5/1994 | Slater | 361/805 |
| 5,339,219 A | | 8/1994 | Urich | 361/760 |

OTHER PUBLICATIONS

U. S. patent applications Publication No. US 2002/0012236 A1, Published Jan. 31, 2002.

* cited by examiner

*Primary Examiner*—Neil Abrams  
(74) *Attorney, Agent, or Firm*—Thomas R. Vigil; Welsh & Katz, Ltd.

(57) ABSTRACT

A breadboard comprising a plate made of an insulating material and having a connection strip portion including a grouping of at least three rows of sets of at least three spaced apart holes in each set in the plate, the centers of the holes in each set being spaced from each other by a predetermined distance defined as a space, groups of at least three connector clips in the plate each connected in at least a three gang grouping, each referred to as a conductive strip which is aligned with and beneath one of the rows of sets of pinholes with all conductive strips being electrically isolated from each other, and all the in each row being offset from the conductive strip in an adjacent row by the predetermined distance and the sets being aligned in each row, end-to-end, with one space between end holes of two adjacent sets in a row, and each row being offset or staggered from each adjacent row by at least one space such that an array of spaces is formed, with each interior space in the middle row forming a center of a diamond shaped four pin socket, that has a connector clip in the plate at each of its four points or corners, that originates from a different conductive strip and that may be used for receipt of a three or four pin component.

19 Claims, 12 Drawing Sheets

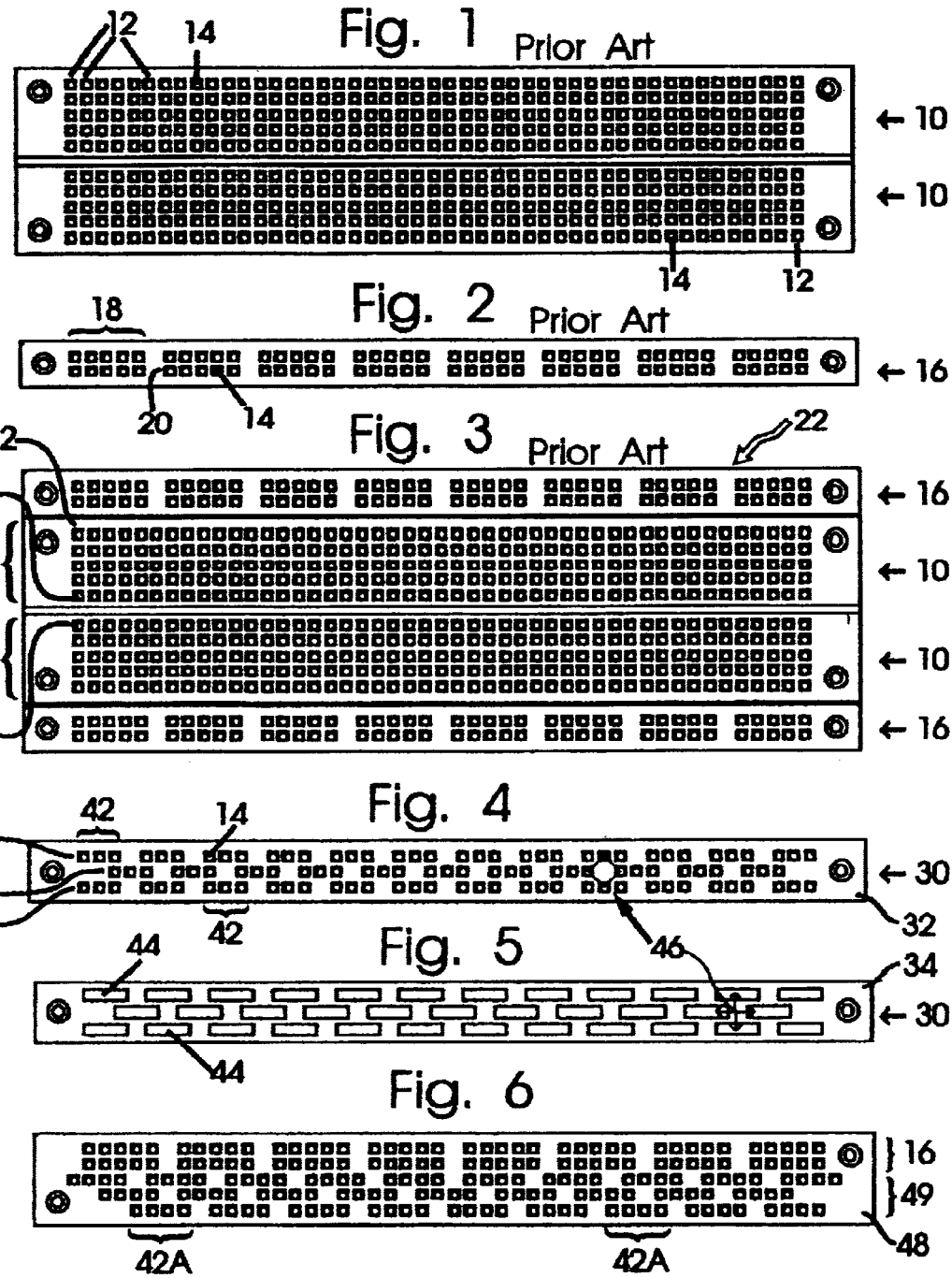

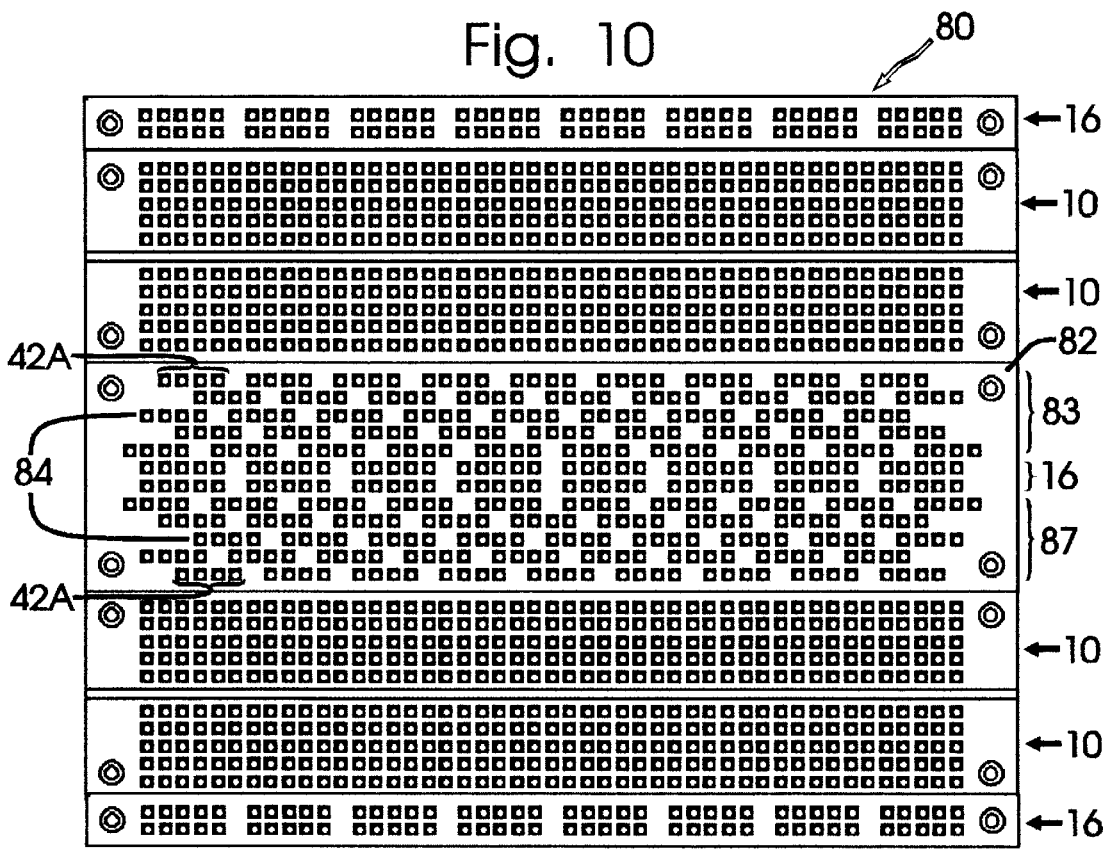

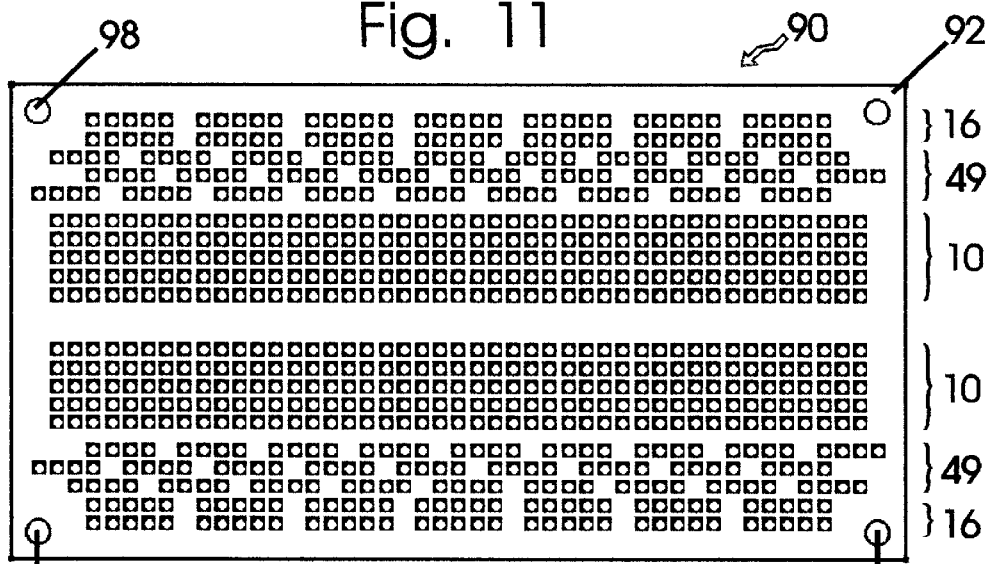
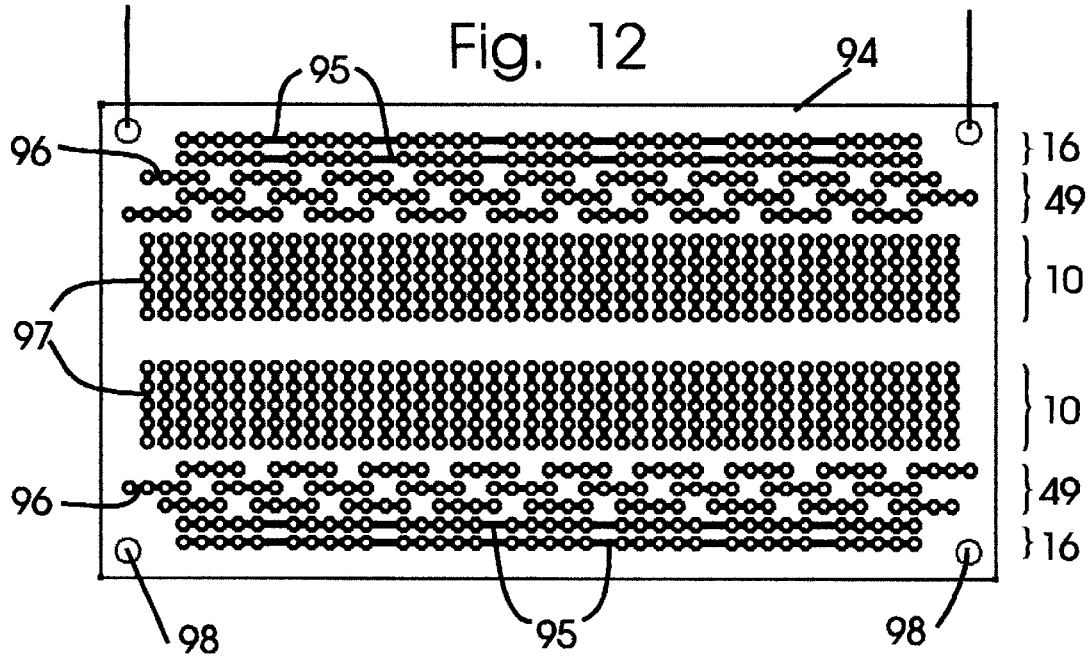

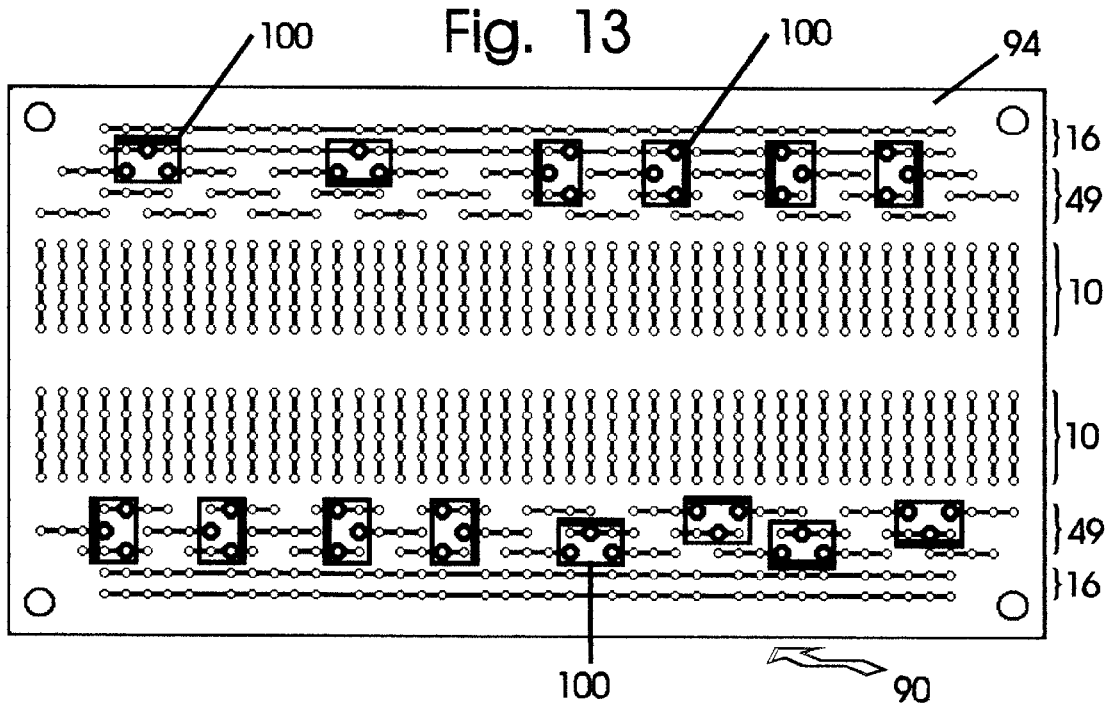

APPARATUS, METHOD AND SYSTEM FOR INTERFACING ELECTRONIC CIRCUITS

BACKGROUND OF THE INVENTION

1. Field of the Invention

The present invention relates to an electrical socket device and a circuit board device. More specifically, the present invention relates to a product commonly known as a solder-less breadboard and a product commonly known as a prototype circuit board, and particularly to a new connection structure that, when used in conjunction with either or both of these prior boards, creates an entirely new method of interfacing electronic circuits that appears to be far superior to any other method available to date.

2. Description of the Related Art

All solder-less breadboards and breadboarding systems available to date are substantially similar to the breadboard design disclosed in U.S. Pat. No. Des. 235,554. This solder-less breadboard is a reusable platform on which temporary electronic circuits can be built, tested, modified and evaluated without having to solder the various electronic components and wires in place. It comprises an insulated electrical socket, or sockets that contain spring clip electrical connectors with a plurality (usually five) contacts spaced on 0.1 inch centers that individual pins or leads of electronic components and wires plug into. There are two basic parts. The first is a distribution strip, which contains one or two rows of connectors running in the same direction as the row that are all electrically connected together, such that it distributes an electrical signal or power to every contact in the row from end to end, with each row electrically isolated from each other, thus distributing two separate voltages or signals. The second is a terminal strip, which typically contains two rows of connectors each having five contacts on 0.1 inch centers running perpendicular to the direction of the row. All the connectors are parallel to each other and electrically isolated from each other. The two rows are electrically isolated from each other and the nearest contacts in each row are spaced on 0.3 inch centers, such that integrated circuits in DIP packages can be plugged into the center of the terminal strip, with each pin plugging into a separate connector. This leaves four available contacts running perpendicular to the integrated circuit and parallel to each other to carry signals to or from the pins. A terminal strip is placed between two distribution strips, such that power or signals run parallel to each other on opposite sides of the terminal strip and perpendicular to the signals on the terminal strip, such that power can be applied to any desired connector on the terminal strip by a short piece of wire from the closest contact on the distribution strip. Wire jumpers can be used to connect signals from any pin on any integrated circuit to any other pin. All other components required by the circuit such as transistors, SCRs, TRIACs, LEDs, etc. must also be plugged into other unused connectors on the terminal strip and then signals run to or from their pins which are interconnected by resistors, capacitors or wires. While there have been many embodiments of this design over the years, including various lengths of the individual pieces, and various mixing and matching of the various pieces of various lengths to create various shapes, sizes and larger capacity systems, there have been no real changes to the functionality of the design. That is to say that the method of placing components and making the required electrical connections between the components in order to build a circuit has not changed. While all of the various embodiments of the design are in themselves extremely useful tools they also all present the user with certain challenges and frustrations that are inherent in the design.

The solder-less breadboard is designed to accommodate integrated circuits in dual inline packages as well as resisters, capacitors, inductors, diodes, transistors and other various components in 3, 4 and more pin packages. The first problem arises out of the fact that 3 and 4 pin devices must be placed in the terminal strip area. This takes up valuable room which lessens the number of integrated circuits that can be placed on the board.

The second problem arises when the various signals on various pins of the integrated circuits need to be interconnected through resistor voltage dividers or resistor/capacitor networks, both of which are common and normal when working with operational amplifiers, timers and mono-stable devices. Again the interconnections of these associated components must be made in the terminal strip area taking away even more room for integrated circuits.

The third problem arises out of the fact that the signal pins on the integrated circuits are practically never in an order that is compatible with pin order of the 3 pin devices. This results in a jumble of crisscrossing interconnecting wires that make the circuit hard to follow and increases the probability of incorrect connections being made in the circuit. This also makes it much more difficult to troubleshoot the circuit and make modifications to the circuit as needed.

The historical solution to these problems has been to use a bigger breadboard. While this solution is very desirable to the breadboard manufactures, it is not cost effective to the user, from which arises the fourth problem: it results in building an extremely large circuit that for obvious reasons is more difficult to transfer to a smaller more usable prototype circuit board for rigorous testing or to a suitable circuit board for the final intended use of the circuit.

The fifth problem arises out of the fact that there is no standardized set of size for size, connection for connection compatible prototype circuit boards available that would allow the user to quickly, easily and accurately transfer the circuit to a circuit board for rigorous testing or final building.

The sixth problem arises from the fact that existing solder-less breadboards and prototype circuit boards are not available in sizes that are compatible with existing standard sized enclosures that are readily available and economically affordable.

The seventh problem arises from the fact that in an engineering environment every new circuit requires a draftsperson to formalize a new schematic, then the new schematic is sent to CAD/CAM to create artwork for a new circuit board design. Then the artwork is used to make a new circuit board, which then has to be drilled and sent back to engineering in order to build a prototype for testing. Any result of testing that requires a change in the circuit also requires this entire process to be repeated. This can be a long process, requiring weeks, months, or even years, to complete a final working prototype.

All of these problems are time consuming and frustrating to the user. When companies are fighting the clock to get their products on the market, time can be more than money, it can be the difference between failure and survival.

Examples of analogous and non-analogous previously proposed breadboards are disclosed in the following analogous and non-analogous U.S. Patents.

| U.S. Pat. No. | Patentee |
| --- | --- |
| 3,205,469 | Frank et al. |
| 4,039,236 | Schepler |
| 4,129,349 | von Roesgen |
| 4,522,449 | Hayward |
| 4,772,864 | Otto et al. |
| 4,791,722 | Miller, Jr. |
| 4,907,127 | Lee |
| 5,014,163 | Lin |
| 5,309,327 | Slater |
| 5,339,219 | Urich |
| Des. 235,554 | Portugal |
| Published Patent Application | |
| 2002/0012236 | DiMarco |

BRIEF SUMMARY OF THE INVENTION

The breadboard design of the present invention solves the problems described above. Accordingly, it is a first aspect of the present invention to provide a new method of interfacing electronic circuits by use of a new system of solder-less breadboard devices and new prototype circuit board devices that contain a new apparatus, while at the same time making the physical dimensions of the devices, with respect to both size and mounting hole, compatible with readily available standard size enclosures and also to provide a new system of add on devices that will allow existing breadboards and breadboard systems to be upgraded in order to allow them to support a new method for interfacing electronic circuits. In order to achieve this first aspect of the present invention, a new electrical socket device is made of an insulated material, having on its top surface at least twelve linear groupings of at least three holes in each group on predetermined, e.g., 0.1 inch, centers, that are aligned on a bottom surface with at least three rows having at least four channels, each channel containing an electrical connector or elongate electrical conductor having at least three contacts on predetermined, e.g., 0.1 inch, centers that are electrically connected together, with all the connectors being electrically isolated from each other, and all the connectors in each row being separated from each other by one space, and each row being offset from each adjacent row by at least one space, such that an array of spaces is formed, with each space in an interior row being the center of a diamond shaped four pin socket, that has a contact at each of its four points, that originate from a different connector, whether the new socket device is molded in a separate piece, or the new socket device is combined with components of at least one other socket similar to either of the sockets found in a conventional breadboard as shown in U.S. Pat. No. Des. 235,554, such that the new socket device can be used with other sockets similar to those sockets in conventional breadboards for the purpose of creating a new solder-less breadboard design for interfacing electronic circuits, or such that the new socket device is combined with both sockets similar to the sockets in conventional breadboards molded in one piece, thereby creating a new solder-less breadboard device for interfacing electronic circuits.

Further, according to another aspect of the present invention, A new printed circuit board device (as shown in FIG. 12) is made of an insulated material, having on its top surface at least twelve linear groupings of at least three holes in each group on 0.1 inch centers, that are aligned on the bottom surface with at least three rows having at least four copper foil traces, each trace having at least three pads with drilled holes on 0.1 inch centers, with all the traces being electrically isolated from each other, and all the traces in each row being separated from each other by one space; and each row being offset from each adjacent row by at least one space, such that an array of spaces is formed, with each space in an interior row being the center of a diamond shaped four pin socket, that has a pad with a drilled hole at each of its four points, that originate from a different trace, whether the new printed circuit board device is a separate piece, or the new printed circuit board device is combined with a foil trace pattern that is equivalent to a socket similar to either of the sockets disclosed in U.S. Pat. No. D235,554 on one circuit board, or whether the new printed circuit board device is combined with foil trace patterns that are equivalent to both sockets similar to the sockets disclosed in U.S. Pat. No. D235,554 on one circuit board which creates a new printed circuit board device for interfacing electronic circuits.

Further, according to a third aspect of the present invention, a new electrical socket device according to the first aspect of the present invention (as shown FIG. 4), is molded in a separate piece such that the new socket device can be used with other sockets similar to those sockets disclosed in U.S. Pat. No. D235,554 for the purpose of creating a new solder-less breadboard device (as shown in FIG. 7) for interfacing electronic circuits.

Further, according to a fourth aspect of the present invention, a new electrical socket device according to the first aspect of the present invention (as shown in FIG. 6) combined with components of at least one other socket similar to either of the sockets disclosed in U.S. Pat. No. D235,554, is molded in one piece such that the new socket device can be used with other sockets similar to those sockets disclosed in U.S. Pat. No. D235,554 for the purpose of creating a new solder-less breadboard device (as shown in FIG. 9), for interfacing electronic circuits.

Further, according to a fifth aspect of the present invention, a new electrical socket device according to the first aspect of the present invention, combined with both sockets similar to the sockets disclosed in U.S. Pat. No. D235,554 is molded in one piece (as shown in FIG. 11), which creates a new solder-less breadboard device for interfacing electronic circuits.

Further, according to a sixth aspect of the present invention, a new printed circuit board device according to the second aspect of the present invention, that is combined with foil trace patterns that are equivalent to both sockets similar to the sockets disclosed in U.S. Pat. No. D235,554 is made on one circuit board which creates a new printed circuit board device (as shown in FIG. 12) for interfacing electronic circuits.

Further, according to a seventh aspect of the present invention, a new system for interfacing electronic circuits that is created by making a new solder-less breadboard device according to the fifth aspect of the present invention (as shown in FIG. 11) and a new printed circuit board device according to the sixth aspect of the present invention (as shown in FIG. 12), that are size for size and connection for connection, identical to each other, such that any electronic circuit that is built on the new solder-less breadboard device can be reproduced exactly on the new printed circuit board device, thus creating a finished working prototype without having to design and build a unique printed circuit board for the electronic circuit.

Further, according to an eighth aspect of the present invention, a new system for interfacing electronic circuits that is created by making a plurality of new solder-less breadboard device according to the seventh aspect of the present invention (as shown in FIGS. 14, 16, 18 and 20) and a plurality of new printed circuit board device according to the seventh aspect of the present invention (as shown in FIGS. 15, 17, 19 and 21) in matching pairs (as shown in FIGS. 14 & 15, 16 & 17, 18 & 19, 20 & 21) such that each pair of devices fit directly into standard sized enclosures, with both devices in each pair having mounting holes that align with the mounting standoffs that exist in the standard sized enclosures, thus allowing mounting without need of modification to either the device or the enclosure.

Further, according to a ninth aspect of the present invention, a new method of interfacing electronic circuits (as shown in FIG. 13) is created by using a new electrical socket device according to the first aspect of the present invention (as shown in FIG. 11) for interconnecting resisters, capacitors, diodes, etc. and connecting transistors, FETs, SCRs, TRIACs, etc. on a solder-less breadboard in an area outside of the terminal strip, such that all interface functions like input signal conditioning, timing, clocking, inter-circuit level changing and output drivers can exist on the same breadboard without sacrificing integrated circuit capacity in the terminal strip, thus making breadboarding quicker, easier and neater while building circuits that are cleaner, easier to follow and more compact.

Further, according to a tenth aspect of the present invention, a new method of interfacing electronic circuits (as shown in FIG. 13) is created by using a new printed circuit board device according to the second aspect of the present invention (as shown in FIG. 12) for interconnecting resisters, capacitors, diodes, etc. and connecting transistors, FETs, SCRs, TRIACs, etc. on a printed circuit prototyping board in an area outside of the terminal strip, such that all interface functions like input signal conditioning, timing, clocking, inter-circuit level changing and output drivers can exist on the same prototype board without sacrificing integrated circuit capacity in the terminal strip, thus making prototyping quicker, easier and neater while building circuits that are cleaner, easier to follow and more compact.

Further, according to an eleventh aspect of the present invention, a new method of interfacing electronic circuits (as shown in FIG. 13) is created by using the new method according to the ninth aspect of the present invention, on anew solder-less breadboard device according to the seventh aspect of the present invention (as shown in FIG. 11) and then exactly reproducing the electronic circuit by using the new method according to the tenth aspect of the present invention, on a new printed circuit board device according to the seventh aspect of the present invention (as shown in FIG. 12) thus dramatically shortening the time required to go from concept to finished working prototype.

Further, according to a twelfth aspect of the present invention, a new method of interfacing an electronic circuits (as shown in FIG. 13) is created by using the new method according to the ninth aspect of the present invention, on a new solder-less breadboard device according to the eighth aspect of the present invention (as shown in FIGS. 14, 16, 18 and 20) and then exactly reproducing the electronic circuit by using the new method according to the tenth aspect of the present invention, on a new printed circuit board device according to the eighth aspect of the present invention (as shown in FIGS. 15, 17, 19 and 21) thus dramatically shortening the time required to go from concept to finished working prototype and allowing the new breadboard device or the new printed circuit board device to fit directly into a standard sized enclosure without need of modification to the device or the enclosure to secure mounting.

BRIEF DESCRIPTION OF THE SEVERAL VIEWS OF THE DRAWINGS

FIG. 1 is a top plan view of a prior art terminal strip.

FIG. 2 is a top plan view of a prior art distribution strip.

FIG. 3 is a top plan view of a prior art, standard, solder-less breadboard including the terminal strip of FIG. 1 and two distribution strips as shown in FIG. 2.

FIG. 4 is a top plan view of a connection strip that can be used in a breadboard constructed according to the teachings of the present invention.

FIG. 5 is a plan view of the conductor strips on the bottom of the breadboard shown in FIG. 4.

FIG. 6 is a top plan view of a solder-less breadboard comprising a distribution strip and a connection strip and is constructed according to the teachings of the present invention.

FIG. 10 is a top plan view of a solder-less breadboard comprising a still further arrangement of distribution strips, terminal strips and connection strips and is constructed according to the teachings of the present invention FIG. 11 is a top plan view of a solder-less breadboard, similar to the breadboard shown in FIG. 7, but with each row of pin holes in the connection strip including four (4) pin holes instead of the three (3) shown in FIG. 7 and is constructed according to the teachings of the present invention.

FIG. 12 is a plan view of the conductor strips on the bottom of a printed circuit board constructed from the breadboard shown in FIG. 11.

FIG. 13 is a plan view, similar to the view shown in FIG. 12, but also showing a number of transistors mounted on the breadboard shown in FIG. 11 and connected to the conductor strips of the connection strips.

DETAILED DESCRIPTION OF THE INVENTION

Figure 7:
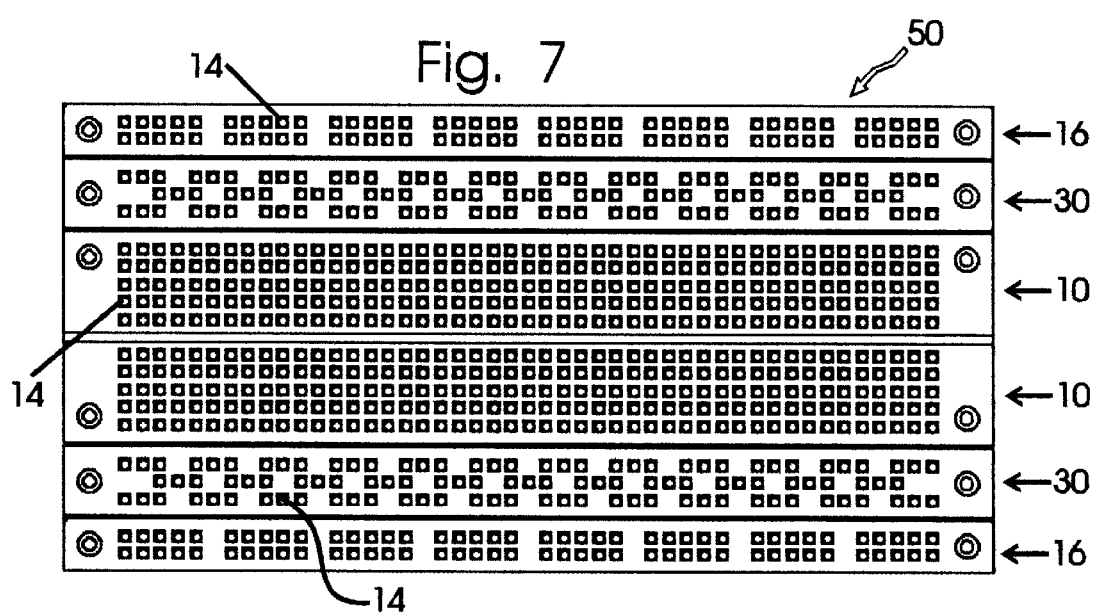
FIG. 7 is a top plan view of a solder-less breadboard comprising a further arrangement of distribution strips, terminal strips and connection strips and is constructed according to the teachings of the present invention.

In FIG. 1 there are illustrated two prior art terminal strips 10 each comprising a plurality of rows 12 of square pinholes 14 and with each row 12 containing five (5) square pinholes.

In FIG. 2 there is illustrated a prior art distribution strip 16 comprising eight (8) pairs 18 of rows 20 of square pinholes 14 and FIG. 3 is a combination of terminal strips 10 and distribution strips 16 arranged to form a prior art breadboard 22 similar to the breadboard shown in U.S. Design Pat. No. 235,554.

Each small square pinhole 14 in the terminal strip 10 represents an electrical contact point 14 including an electrical clip which is hidden from view and which can be of the type shown in the Lin U.S Pat. No. 5,014,163 or in the Portugal Des. 235,554. Each row 12 of five contact points 14 viewing same in the vertical direction are electrically connected to each other by a conductor strip therebeneath and hidden from view, and each one row 12, with five contact points 14 being electrically isolated from adjacent rows 12. Thus the terminal strip 10 can be viewed as two banks 24 and 26 of row connectors 12 that allow the interconnection of electrical components viewing the strip 10 in the vertical direction.

There is a 0.3 inch center to center spacing between the bottom contact point 14 of each row 12 in the top bank 24 and the top contact point 14 of each row 12 in the bottom bank 26 of the terminal strip 10. This spacing is consistent with that of a dual inline package integrated circuit. Thus integrated circuits can be plugged into the center portion of the strip such that each pin of the integrated circuit then has four available contact points 14 that can carry electrical signals to or from it.

All other electrical components in the circuit must also have their pins plugged into contact points 14 in the terminal strip 10 in order to be connected.

Again, each small square pinhole 14 in the distribution strip 16 represents an electrical contact point 14. All of the contact points 14 in each horizontal row 20 are electrically connected to each other, however the two rows are electrically isolated from each other. Thus the distribution strip 16 uses pairs 18 of rows 20 to distribute two separate electrical signals or power viewing the strip 16 in the horizontal direction from end to end.

A standard solder-less breadboard 22 is shown in FIG. 3 and is created by placing a pair of terminal strips 10 between two (2) distribution strips 16.

As shown in FIG. 4, a new connection strip 30, made of an insulated material, has on its top surface 32, at least three lines 36, 38 and 40 of twelve linear groupings or strips 42 with at least three pinholes or contact points 14 in each group 42 on 0.1 inch centers, that are aligned with at least three rows of conductor strips or channels 44 (FIG. 5) on the bottom surface 34, each channel 44 having an electrical conducting strip 44 having at least three contact points 14 on 0.1 inch centers that are electrically connected together, with all the conductor strips 44 being electrically isolated from each other, and all the contact points 14 in each group 42 being separated from each other by one space, and each group 42 being offset or staggered from each adjacent group 42 by at least one space, such that an array of spaces is formed, with each space in an interior line being the center of a diamond shaped four pin socket 46 (FIG. 4), that has a contact point 14 at each of its four points, that originate from a different connector strip 42/conductor strip 44. This arrangement is an important teaching of the present invention. It is to be noted that in the breadboards constructed according to the teachings of the present invention, the connector clips are in gangs of three or four or five or more clips integrally connected by a strip of metal, much like the "terminals" disclosed in the Lin U.S. Pat. No. 5,014,163, and are imbedded or mounted in the bottom surface of the plate of the breadboard. FIG. 6 shows a distribution strip section 16 combined in one plate or board 48 with a connector strip section 49 having 4 pinhole 14 groupings 42A.

FIG. 7 shows a new solder-less breadboard 50 constructed according to the teachings of the present invention. In this embodiment, a connection strip 30 is placed on the top and bottom between a center double terminal strip 10 and a upper or lower distribution strip 16.

Figure 8:
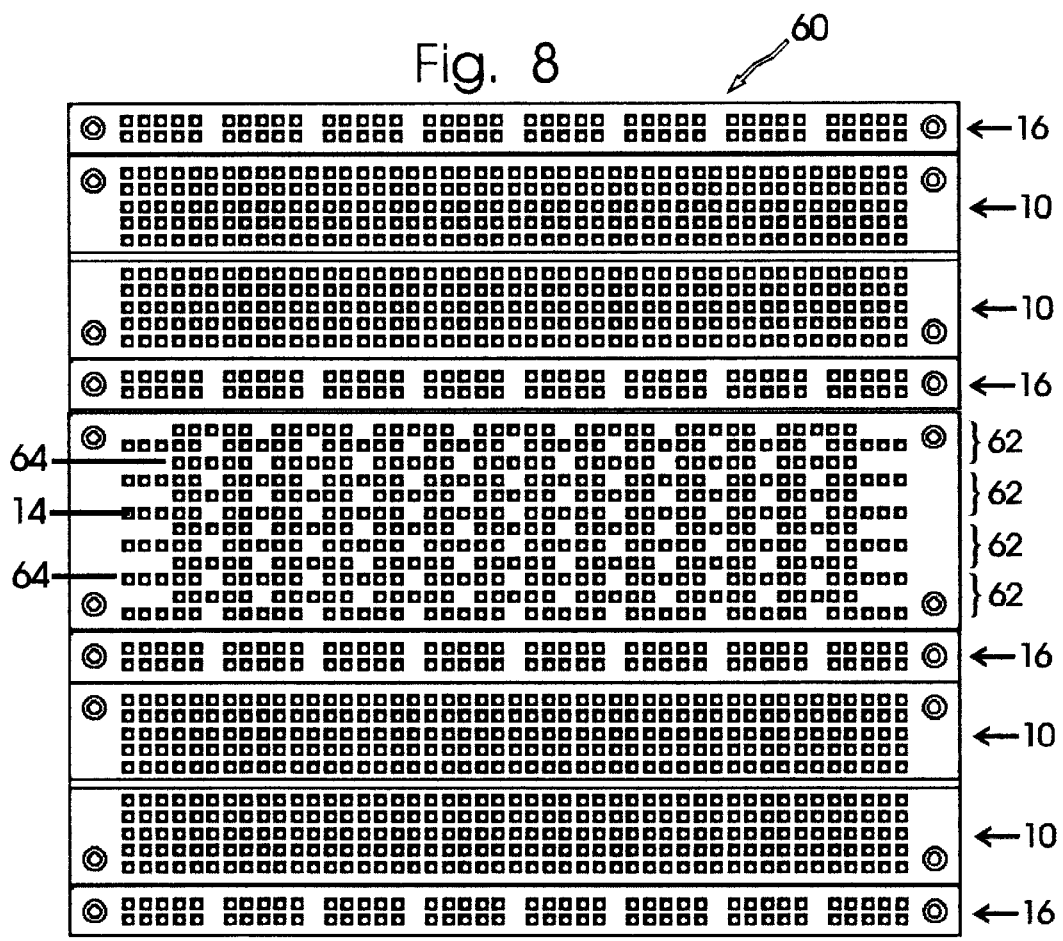
FIG. 8 is a top plan view of a solder-less breadboard comprising another arrangement of distribution strips, terminal strips and connection strips and is constructed according to the teachings of the present invention

A large breadboard 60 is shown in FIG. 8. In this embodiment more strip sections 16, 10, 10, 16, 49, 49, 49, 49, 16, 10, 10 and 16 are employed.

More specifically, the breadboard 60 includes, from top to bottom, a distribution strip section 16, a double terminal strip section 10, a distribution strip section 16, four (4) modified connection strip sections 62 equivalent to connection strip sections 49, each including groups 64 of five (5) pinholes or contact points 14 instead of four (4) and where each group 64 is offset or staggered from each adjacent group 64 creating an array of spaces according to the teaching of the present invention, a distribution strip section 16, a double terminal strip section 10 and a distribution strip section 16.

Figure 9:
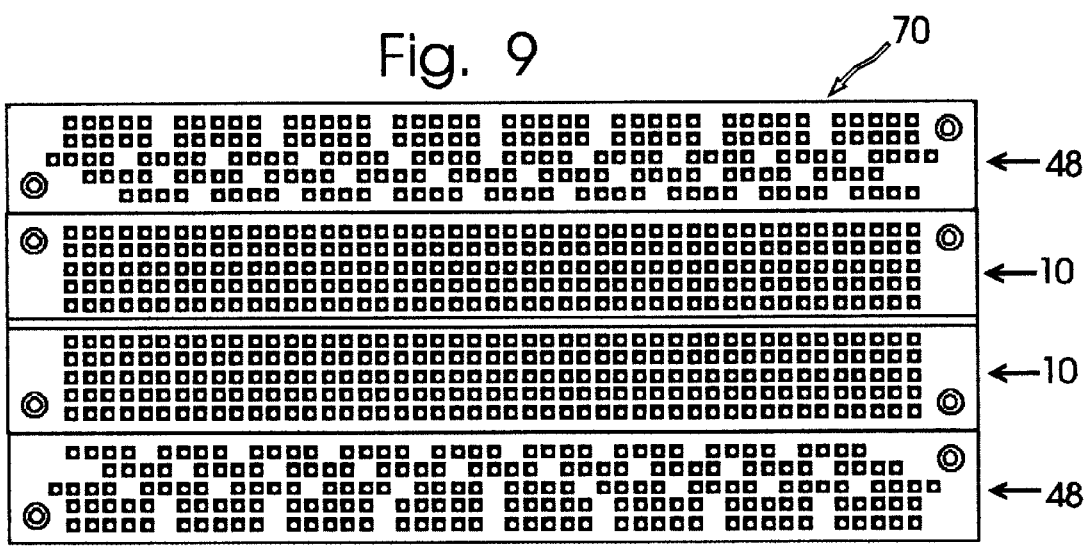
FIG. 9 is a top plan view of a solder-less breadboard comprising still another arrangement of distribution strips, terminal strips and connection strips and is constructed according to the teachings of the present invention

In FIG. 9 is illustrated a breadboard 70 having a different arrangement of strip sections 10, 16 and 49.

More specifically, the breadboard 70 includes, from top to bottom, a combined distribution strip and modified connection strip 48 (FIG. 6), a double terminal strip 10, a combined distribution strip and modified connection strip 48 that is rotated 180 degrees.

In FIG. 10 is illustrated a breadboard 80 which includes, from top to bottom, a distribution strip 16, a double terminal strip 10, a connection strip 82 including a first grouping 83 of five linear groups 84 each including nine (9) groups 42A of pinholes or contact points 14 with four pinholes or contact points 14 per group 42A and where each group 84 is offset or staggered from each adjacent group 84 creating an array of spaces according to the teaching of the present invention, a 10 distribution strip section 16 and a second group 87 of five linear groups 84, a double terminal strip 10 and a distribution strip 16.

In FIG. 11 is illustrated a breadboard 90 which includes a one piece, continuous board or plate 92 of insulating material and, from top to bottom in the plate 92, a distribution strip section 16, a modified connection strip section 49, a double terminal strip section 10, a modified connection strip section 49 and a distribution strip section 16 that is molded in one piece.

Another important teaching of the present invention is that a matching printed circuit board is made from the pattern of the connector clips that are imbedded in each of the breadboards that are made in one piece. It is to be noted that for purposes of clarity, drawings of said circuit boards will be used to demonstrate the electrical characteristics of the connector clips used in said breadboards.

FIG. 12 shows a plan view of an underside 94 of the plate 92 which shows conductive strips 95 which are located beneath the distribution strip sections 16 in a printed circuit board made from the breadboard, conductive strips 96 beneath the modified connection strip sections 49 and conductive strips 97 beneath the terminal strip section 10 and four corner mounting holes 98 in the corners of each plate 92 and 94. It will be understood that the strips 95, 96 and 97 are illustrative of the arrays or gangs of connector clips in the plate 92.

A new method of interfacing electronic circuits is illustrated in FIG. 13. Here, fourteen transistors 100 are shown mounted on the top surface of the breadboard 90 and demonstrate that every possible pin of a three pin transistor or other electronic device 100 can be accommodated while controlling signal direction.

The six transistors 100 depicted on the upper side of the breadboard 90 demonstrate all six possible ways of orienting a transistor such that one pin is always connected directly to a power buss in the distribution strip, this configuration being used for power switching transistors, SCRs and TRIACs. It should be noted that the inter pin spacing on a standard solder-less breadboard 22 (FIG. 3) will not accommodate direct connection to a power buss.

The eight transistors 100 depicted on the lower side of the breadboard 90 shown in FIG. 13 demonstrate eight possible ways of orienting a transistor such that all pins are isolated from the power buss, this configuration being used for amplifiers, oscillators, inverters, level changing, etc. It should be noted that a standard solder-less breadboard can only accommodate two possible orientations.

The structure shown in FIG. 13 further demonstrates that there are fourteen devices mounted on the board 90, with a total of forty two electrical connections, yet not one connection in the terminal strip section 10 has been used, thus this board can still hold it's full compliment of integrated circuits. It should be noted that on a standard solder-less breadboard of this size, if fourteen transistors were mounted with no spaces left between them for biasing components, the board could hold only one half of it's compliment of integrated circuits and, if one space were left between each transistor, the board could hold only one third of it's compliment of integrated circuits.

The breadboard 90, plate 92 and circuit board, plate 94 are sized to fit directly into an ABS plastic enclosure similar to Radio Shack part no. 270-1805.

Figure 14:
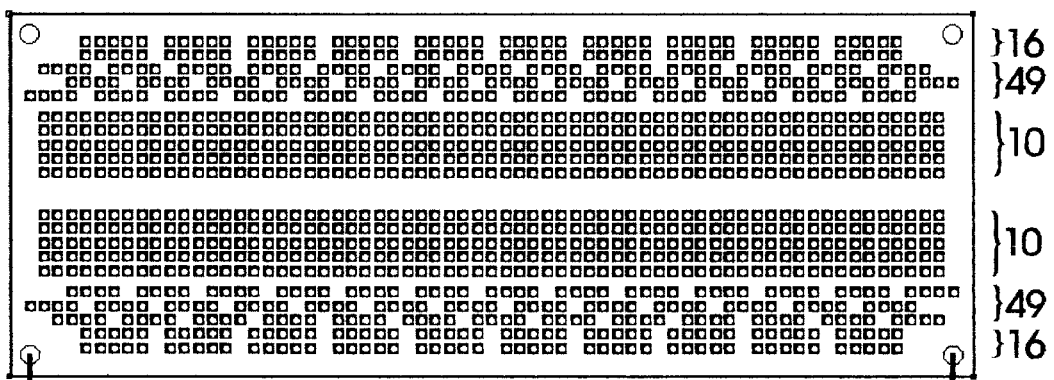
FIG. 14 is a top plan view a solder-less breadboard comprising a further arrangement of distribution strips, terminal strips and connection strips and is constructed according to the teachings of the present invention.

Another, one-piece-molded, breadboard 110 is illustrated in FIG. 14. This breadboard 110 is similar to but longer than the breadboard 90 shown in FIG. 11 and includes, from top to bottom, a distribution strip section 16, a modified connection strip section 49, a double terminal strip section 10, a modified connection strip section 49 and a distribution strip section 16 and four corner mounting holes 98.

Figure 15:
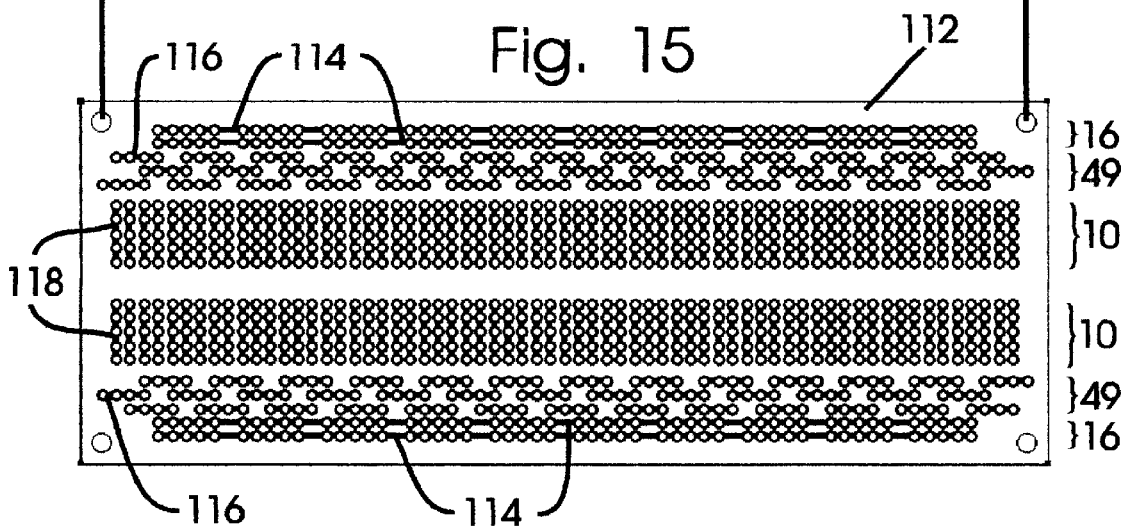
FIG. 15 is a plan view of the conductor strips on the bottom of a printed circuit board constructed from the breadboard shown in FIG. 14.

In FIG. 15 is shown an underside 112 of a printed circuit board made from the breadboard 110, with conductive strips 114, 116 and 118 and four corner mounting holes 98, identical to FIG. 14. Both of these plates 110 and 112 fit directly into an ABS plastic enclosure similar to Radio Shack part no. 270-1808.

Figure 16:
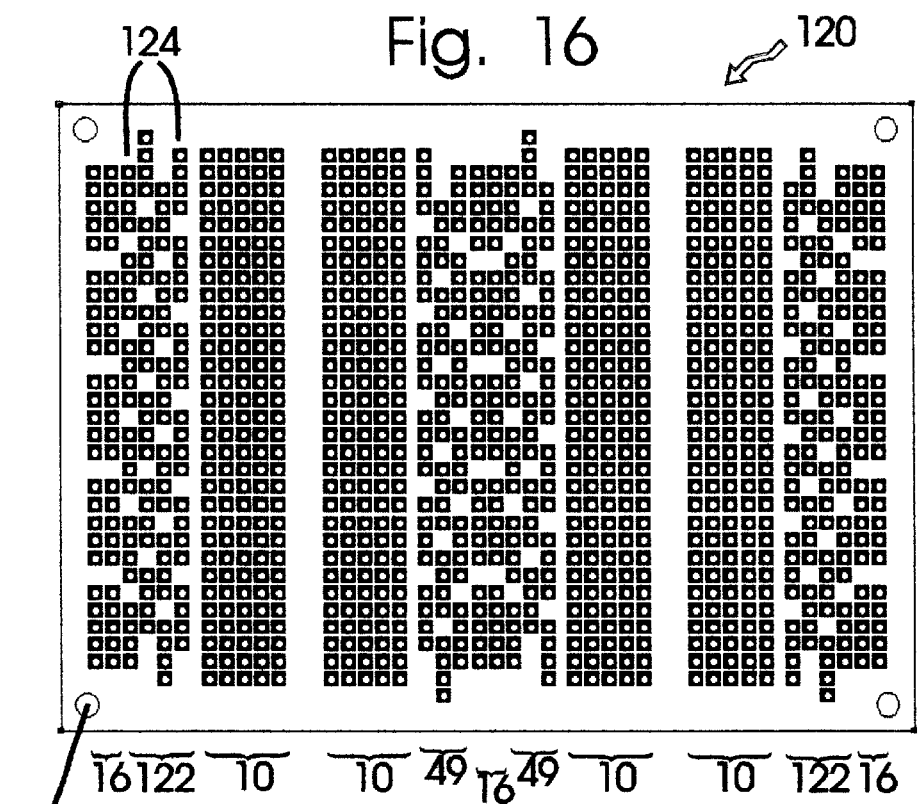
FIG. 16 is a top plan view of a solder-less breadboard comprising a still further arrangement of distribution strips, terminal strips and connection strips and is constructed according to the teachings of the present invention.
Figure 17:
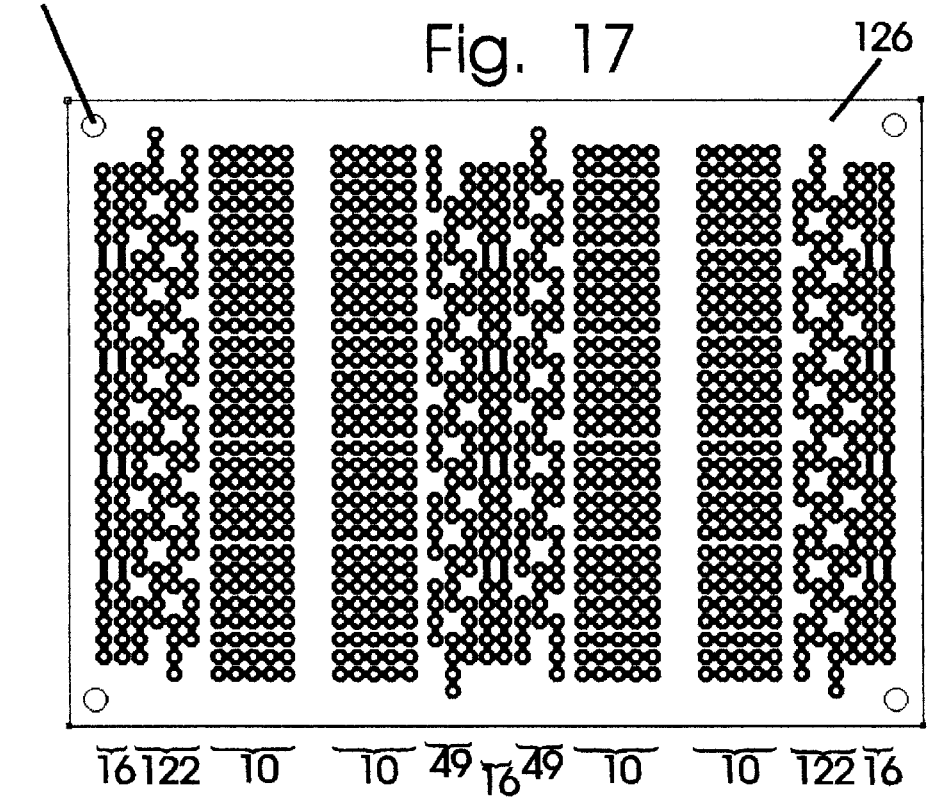
FIG. 17 is a plan view of the conductor strips on the bottom of a printed circuit board constructed from the breadboard shown in FIG. 16.

In FIG. 16 is illustrated a further, one-piece-molded breadboard 120 which includes from left to right, a distribution strip section 16, a third modified connection strip section 122 with four linear groupings 124, a double terminal strip section 10, a modified connection strip section 49, a distribution strip section 16, a modified connection strip section 49, a double terminal strip section 10, a modified connection strip section 122 and a distribution strip section 16. An underside 126 with conductive strips of a printed circuit board which is constructed from the breadboard 120 is shown in FIG. 17. The breadboard 120 and circuit board 126 fit directly into an ABS plastic enclosure similar to Radio Shack part no. 270-1806.

Figure 18:
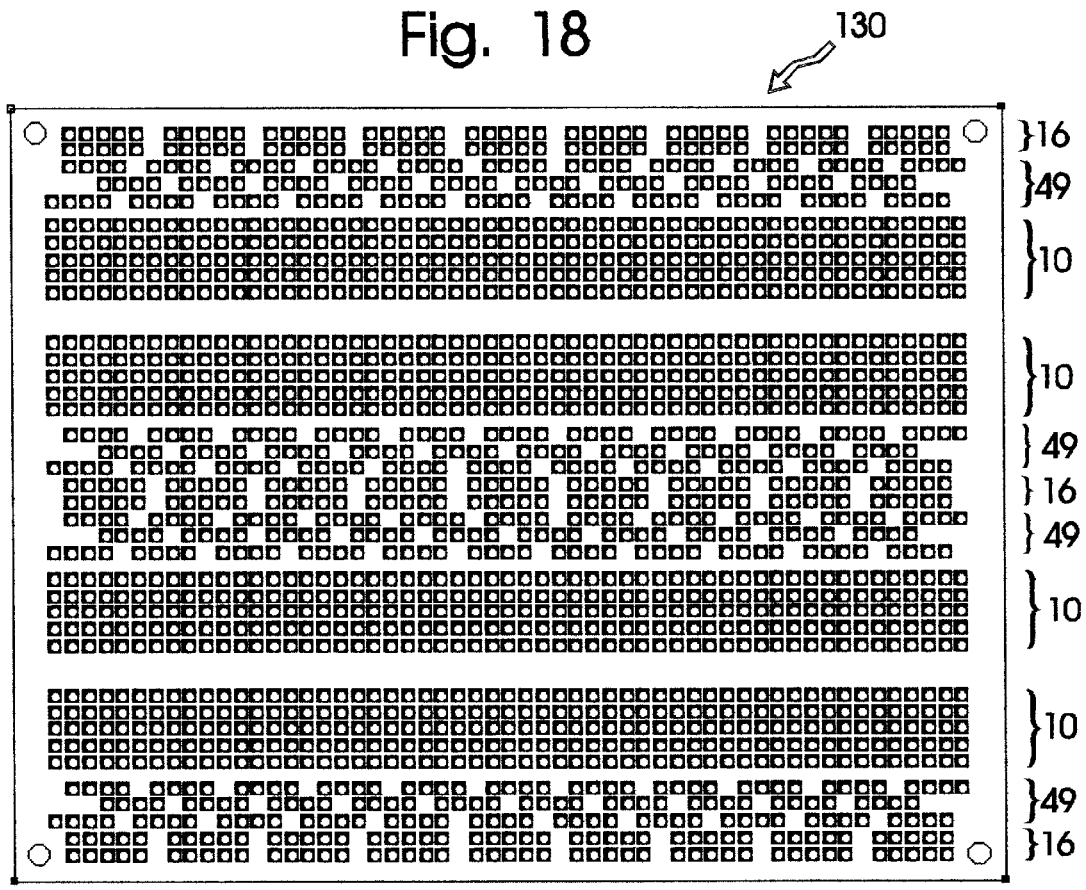
FIG. 18 is a top plan view of a solder-less breadboard comprising still another arrangement of distribution strips, terminal strips and connection strips and is constructed according to the teachings of the present invention.
Figure 19:
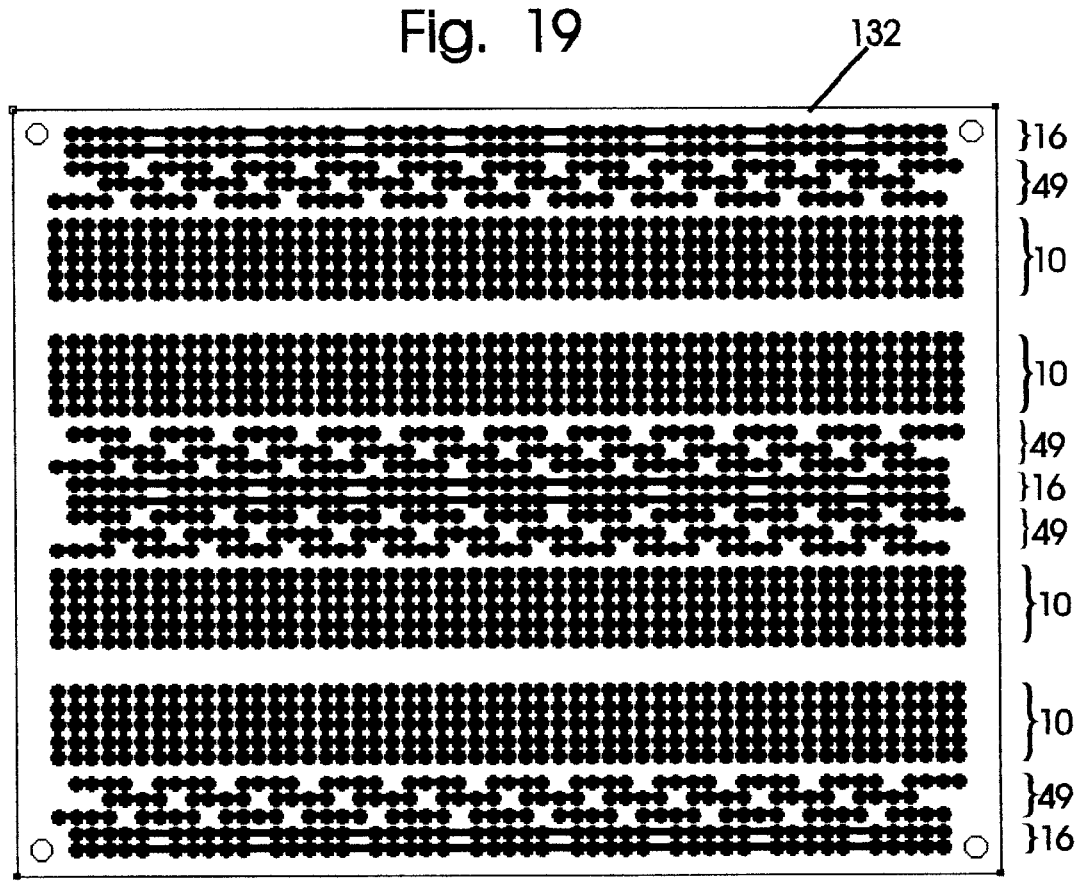
FIG. 19 is a plan view of the conductor strips on the bottom of a printed circuit board constructed from the breadboard shown in FIG. 18.

In FIG. 18 is illustrated a still further, one-piece-molded, breadboard 130 including, from top to bottom, a distribution strip section 16, a modified connection section 49, a double terminal strip section 10, a modified connection strip section 49, a distribution strip section 16, a modified connection section 49, a double terminal strip section 10, a modified connection strip section 49 and a distribution section 16. An underside 132 with conductive strips or channels of a printed circuit board which is constructed from the breadboard 130 is shown in FIG. 19. The breadboard 130 and circuit board 132 fit directly into an ABS plastic enclosure similar to Radio Shack part no. 270-1807.

Figure 20:
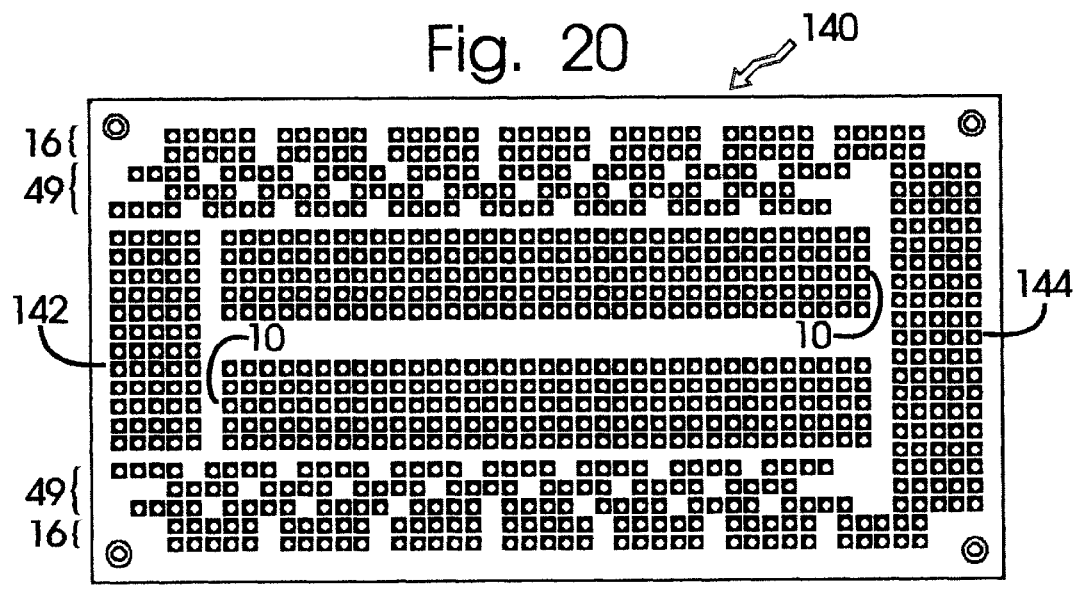
FIG. 20 is a top plan view of a solder-less breadboard comprising still another arrangement of distribution strips, terminal strips and connection strips and is constructed according to the teachings of the present invention.
Figure 21:
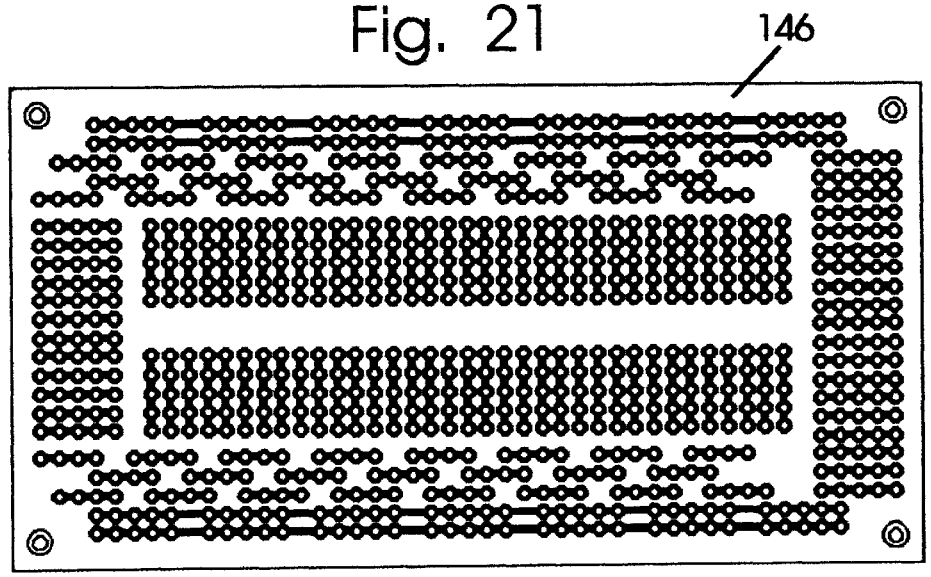
FIG. 21 is a plan view of the conductor strips on the bottom of a printed circuit board constructed from the breadboard shown in FIG. 10.

Still another, one-piece-molded, breadboard 140 is illustrated in FIG. 20 and includes, from top to bottom, a distribution section 16 a modified connection section 49, a shorter double terminal strip section 10, a modified connection strip section 49 and a distribution section 16 plus a short bank 142 of strips of pinholes or contact points 14 on the left side and a longer bank 144 of strips of pinholes or contact points 14 on the right side. This breadboard 140 is designed for use with embedded processors such as PIG devices. Notice that bank 142 at the far left is used for a programming 110 connector, the far right bank 144 is used for a general IO connector. FIG. 21 illustrates an underside 146 with conductive strips or channels of a printed circuit board which is constructed from the breadboard 140. The breadboard 140 and circuit board 146 fit directly into an ABS plastic enclosure similar to Radio Shack part no. 270-1805.

Although the present invention has been described in detail concerning methods, means and preferred embodiments, these details are in no way intended to be all-inclusive nor are they intended to limit the claims of the present invention. Further, it should be understood that there are, within the teachings of the present invention, other applications for and embodiments of the present invention.

Accordingly, the scope of the present invention is only to be limited as necessitated by the appended claims.

I claim:

1. A breadboard comprising a plate made of an insulating material and having a connection strip portion including a grouping of at least three rows of sets of at least three spaced apart holes in each set in the plate, the centers of the holes in each set being spaced from each other by a predetermined distance defined as a space, groups of at least three connector clips in the plate each connected in at least a three gang grouping, each grouping being referred to as a conductive strip which is aligned with and beneath one of the rows of sets of holes with all conductive strips being electrically isolated from each other, and all said conductive strips in each row being offset from the conductive strip in an adjacent row by said predetermined distance and the sets being aligned in each row, end-to-end, with one space between end holes of two adjacent sets in a row, and each row being offset or staggered from each adjacent row by at least one space such that an array of spaces is formed, with each interior space in the middle row forming a center of a diamond shaped four pin socket, that has a connector clip in the plate at each of its four points or corners, that originates from a different conductive strip.

2. The breadboard of claim 1 wherein said space is approximately 0.1 inch.

3. The breadboard of claim 1 combined with a terminal strip portion in said plate comprising at least one elongate grouping of transversely extending rows of holes, with each row containing three to seven holes, a conductive strip of connector clips situated in the plate beneath each row, each hole defining an electrical contact point on the conductive strip, with all of the conductive strips being electrically isolated from each other, and the adjacent holes having a predetermined center-to-center spacing between them.

4. The breadboard of claim 3 comprising two elongate groupings of transversely extending rows of holes.

5. The breadboard of claim 4 wherein the two groupings are spaced apart a distance which will result in an end hole in one row of holes in one grouping of rows of holes having a center-to-center distance of approximately 0.3 inch with the closest end hole in a row of holes in the other grouping of rows of holes.

6. The breadboard of claim 3 wherein the center-to-center spacing between adjacent pinholes is approximately 0.1 inch.

7. The breadboard of claim 3 wherein each row comprises five spaced apart pinholes.

8. The breadboard of claim 1 combined with a distribution strip portion comprising at least one line of groups of spaced apart holes in the plate, each group comprising three to seven holes with adjacent holes being separated by a predetermined center-to-center spacing and the end holes in adjacent end-to-end groups being spaced apart by said spacing.

9. The breadboard of claim 8 wherein said center-to-center spacing is approximately 0.1 inch.

10. The breadboard of claim 1 wherein each set of holes includes at least four holes and each group of connection clips include at least four clips in a four gang grouping.

11. The breadboard of claim 1 wherein each set of pinholes includes at least five pinholes and each group of connection clips include at least five clips in a five gang grouping.

12. A breadboard comprising a plate made of an insulating material and having a connection strip portion including a grouping of at least three rows of sets of at least three spaced apart holes in each set in the plate, the centers of the holes in each set being spaced from each other by a predetermined distance defined as a space, groups of at least three connection clips in the plate each connected in an at least a three gang grouping, each grouping being referred to as a conductive strip which is aligned with and beneath one of the rows of sets of holes with all conductive strips being electrically isolated from each other, and all said conductive strips in each row being offset from the conductive strip in an adjacent row by said predetermined distance and the sets being aligned in each row, end-to-end, with one space between end holes of two adjacent sets in a row, and each row being offset or staggered from each adjacent row by at least one space such that an array of spaces is formed, with each interior space in a middle row forming a center of a diamond shaped four pin socket, that has a conductive clip in the plate at each of its four points or corners, that originate from a different conductive strip, a terminal strip portion in said plate comprising at least one elongate grouping of transversely extending rows of holes, with each row containing three to seven holes, a conductive strip of connector clips situated in the plate beneath each row, each hole defining an electrical contact point on the conductive strip, with all of the conductive strips being electrically isolated from each other, and the adjacent holes having a predetermined center-to-center spacing between them and a distribution strip portion comprising at least one line of groups of spaced apart holes in the plate, each group comprising three to seven holes with adjacent holes being separated by a predetermined center-to-center spacing and the end holes in adjacent end-to end groups being spaced apart by said spacing.

13. The breadboard of claim 12 wherein the terminal strip portion comprises two elongate groupings of transversely extending rows of holes.

14. The breadboard of claim 13 wherein the two groupings are spaced apart a distance which will result in an end hole in one row of holes in one grouping of rows of holes having a center-to-center distance of approximately 0.3 inch with the closest end hole in a row of holes in the other grouping of rows of holes.

15. The breadboard of claim 12 wherein said connection strip portion, said terminal strip portion and said distribution strip portion are all formed in a one piece, integral plate.

16. The breadboard of claim 12 wherein said connection strip portion, said terminal strip portion and said distribution strip portion are formed in separate plates and then assembled together to form the breadboard.

17. The breadboard of claim 12 being sized to fit directly into a commercially available project box.

18. A method of bread-boarding comprising the steps of: providing a plate made of an insulating material; providing a connection strip section in the plate including a grouping of at least three rows of sets of at least three spaced apart holes in each set in the plate, the centers of the holes in each set being spaced from each other by a predetermined distance defined as a space, groups of at least three connector clips in the plate connected in an at least a three gang grouping each grouping being referred to as a conductive strip, each of which is aligned with and beneath one of rows of sets of holes with all conductive strips being electrically isolated from each other, and all said conductive strips in each row being offset from the conductive strip in an adjacent row by said predetermined distance and the sets being aligned in each row end-to-end with one space between end holes of two adjacent sets in a row, and each row being offset or staggered from each adjacent row by at least one space, such that an array of spaces is formed, with each interior space in the middle row forming a center of a diamond shaped four pin socket, that has a connector clip in the plate at each of its four points or corners, that originates from a different conductive strip.

19. A printed circuit board comprising a plate made of an insulating material and having a connection strip portion including a grouping of at least three rows of sets of at least three spaced apart holes in each set in the plate, the centers of the holes in each set being spaced from each other by a predetermined distance defined as a space, groups of conductive strips in the plate in, or on the underside of, the plate, each conductive strips being aligned with and extending beneath one of the rows of three spaced apart holes with all of the conductive strips being electrically isolated from each other, and all said conductive strips in each row being offset from a conductive strip in an adjacent row by said predetermined distance and the sets being aligned in each row end-to-end with one space between end holes of two adjacent sets in a row and each row being offset or staggered from each adjacent row by at least one space, such that an array of spaces is formed, with each interior space in the middle row forming a center of a diamond shaped four pin socket, that has a connection point on a conductive strip at each of its four points or corners, that originates from a different conductive strip.

* * * * *